(12) United States Patent
Li et al.

(10) Patent No.: US 7,515,419 B2
(45) Date of Patent: Apr. 7, 2009

(54) LOCKING DEVICE FOR HEAT SINK

(75) Inventors: Dong-Yun Li, Shenzhen (CN); Min Li, Shenzhen (CN); Hong-Cheng Yang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 137 days.

(21) Appl. No.: 11/308,226

(22) Filed: Mar. 13, 2006

(65) Prior Publication Data

US 2007/0103870 A1  May 10, 2007

(30) Foreign Application Priority Data

Nov. 10, 2005  (CN) .................. 2005 1 0101209

(51) Int. Cl.
*H05K 7/20* (2006.01)
(52) U.S. Cl. .............. 361/704; 361/709; 165/80.3; 24/458
(58) Field of Classification Search .......... 361/704, 361/709, 710, 719; 174/16.3; 257/E23.086, 257/718–719; 165/80.3, 185; 24/458
See application file for complete search history.

(56) References Cited

U.S. PATENT DOCUMENTS

| | | | |
|---|---|---|---|
| 5,323,845 A | | 6/1994 | Kin-shon |
| 5,448,449 A | * | 9/1995 | Bright et al. ............... 361/704 |
| 5,678,627 A | * | 10/1997 | Lee ............................ 165/80.3 |
| 6,175,499 B1 | | 1/2001 | Adams et al. |
| 6,707,672 B2 | * | 3/2004 | Liu ............................ 361/704 |
| 6,768,641 B2 | * | 7/2004 | Li .............................. 361/719 |
| 6,785,136 B2 | * | 8/2004 | Chang et al. ............... 361/704 |
| 6,788,538 B1 | | 9/2004 | Gibbs et al. |
| 6,822,869 B2 | * | 11/2004 | Huang et al. ............... 361/704 |
| 6,867,975 B2 | * | 3/2005 | Kashiwagi ................. 361/704 |
| 7,206,206 B2 | * | 4/2007 | Lin et al. .................... 361/719 |
| 7,233,496 B2 | * | 6/2007 | Lee et al. .................... 361/720 |
| 2002/0118513 A1 | * | 8/2002 | Koseki et al. .............. 361/709 |
| 2003/0210528 A1 | * | 11/2003 | Huang et al. ............... 361/709 |
| 2005/0094377 A1 | * | 5/2005 | Lee et al. .................... 361/704 |
| 2006/0056152 A1 | * | 3/2006 | Li et al. ...................... 361/697 |
| 2007/0115642 A1 | * | 5/2007 | Ho ............................. 361/710 |

FOREIGN PATENT DOCUMENTS

CN  2479560 Y  2/2002
CN  2559188 Y  7/2003

* cited by examiner

*Primary Examiner*—Jayprakash N Gandhi
*Assistant Examiner*—Courtney L Smith
(74) *Attorney, Agent, or Firm*—Frank R. Niranjan

(57) ABSTRACT

A locking device used for locking a heat sink to an electronic device, includes two clips each having a clamping portion. The clamping portion of each has a first pressing portion, a second pressing portion spaced from and in alignment with the first pressing portion, and a catch depending between the first and second pressing portions. An operating portion extends from the second pressing portion of the clamping portion. The retention module includes a bottom with an opening defined therein, and two pairs of first and second clasps extending from the bottom for locking the two clips. When the retention module and the clips are in a locked position, the catches of the clips engage with the first clasps of the retention module, the operating portions engage with the second clasps of the retention module.

4 Claims, 3 Drawing Sheets

LOCKING DEVICE FOR HEAT SINK

FIELD OF THE INVENTION

The present invention relates generally to a locking device, and more particularly to a locking device for securing a heat sink to an electronic device.

DESCRIPTION OF RELATED ART

It is well known that electronic devices generate large amounts of heat during operation. The more rapidly the electronic devices operate, the more heat they generate. If the heat is not quickly dissipated, the operation of the electronic devices will suffer. Generally, in order to ensure normal running of the electronic device, a heat sink is used to dissipate the heat generated by the electronic device. And in order to keep the heat sink intimately contacting the electronic device, a locking device is usually desired to secure the heat sink to the electronic device.

With the advance of computer technology, computer systems have tended to miniaturization, low cost and ease of assembly. At the same time, heat sinks attached to the electronic devices in the computer system require miniaturization to suit the needs of modern electronic devices. However, locking devices currently used for securing the heat sinks to the electronic devices generally have complex configurations, large volumes, and are complex in assembly or disassembly. Therefore, the locking devices need more space in the computer system to accommodate them and to give enough room to allow assembly/disassembly of the heat sinks to/from the electronic devices. For example, an elongated-strap-shaped locking device needs to rest on a base of the heat sink, which adversely impacts heat-dissipating area of the heat sink. In assembly, the locking device needs tools to engage locking legs thereof with a retention module, which can interfere with other components around the heat sink. Additionally, some of these locking devices are overly laborious or complex to use when assembling/disassembling the heat sink to/from the electronic devices.

What is needed, therefore, is a locking device which secures a heat sink to an electronic device both conveniently and effectively.

SUMMARY OF INVENTION

A locking device in accordance with an embodiment of the present invention is used for securing a heat sink to an electronic device. The heat sink comprises a fin set defining two channels adjacent to two opposite ends thereof. The locking device comprises a retention module supporting the heat sink thereon and two clips securing the heat sink toward the retention module. The retention module comprises a bottom with an opening defined therein having the heat sink resting thereon, and two pairs of first and second clasps extending from the bottom for locking the two clips. Each of the two clips comprises first and second pressing portions fitted in a corresponding channel of the fin set, a catch between the first and second pressing portions, and an operating portion extending from an end of the second pressing portion. When the retention module and the clips are in a locked position, the catches of the clips engage with the first clasps of the retention module, the operating portions of the two clips engage with the second clasps of the retention module, the first and second pressing portions of the two clips press the fin set of the heat sink toward the retention module.

Other advantages and novel features will become more apparent from the following detailed description of preferred embodiments when taken in conjunction with the accompanying drawings, in which:

DETAILED DESCRIPTION

Figure 1:
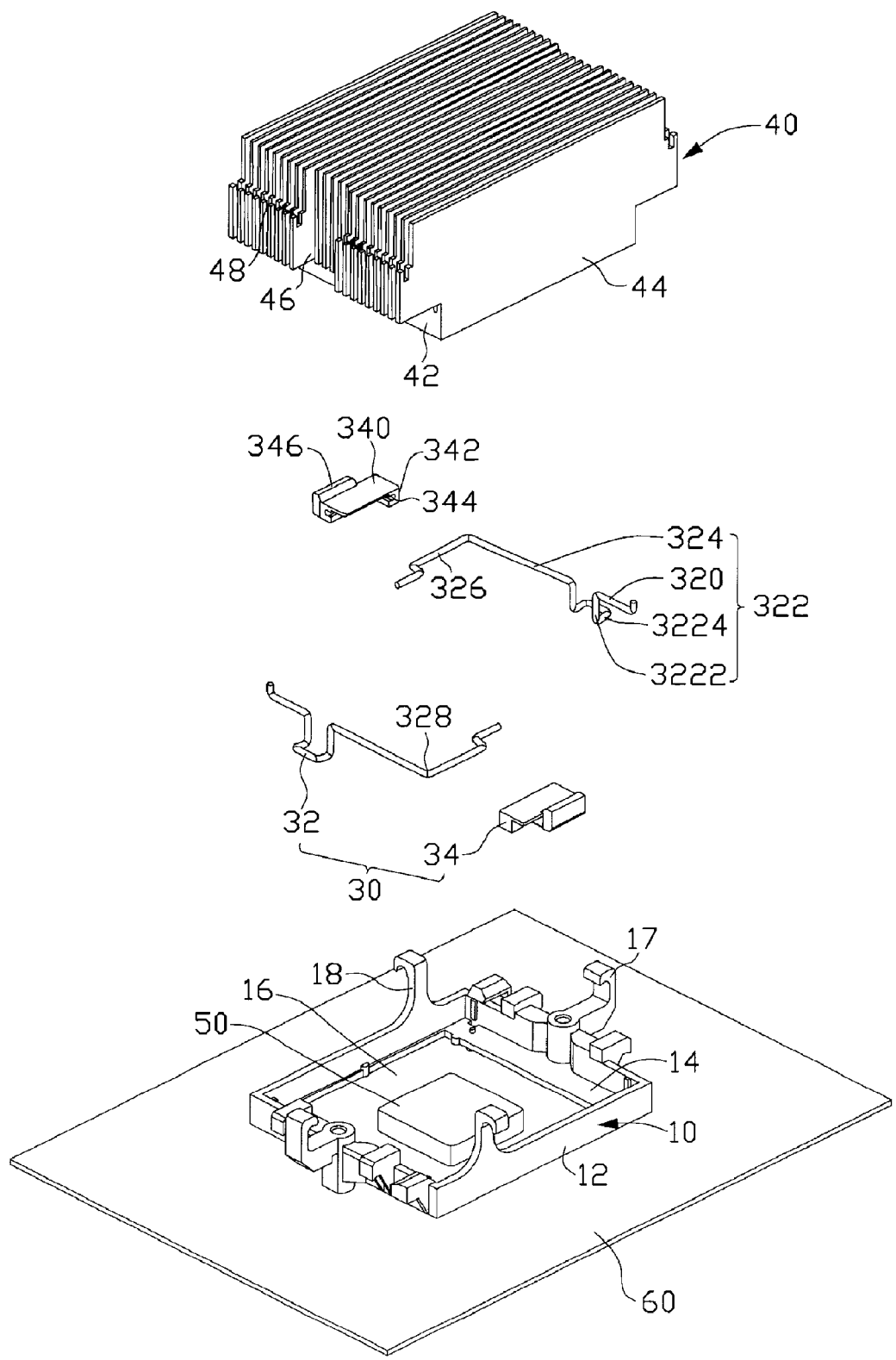
FIG. 1 is an exploded, isometric view of a locking device with relevant components in accordance with a preferred embodiment of the present invention.

Referring to FIG. 1, in accordance with a preferred embodiment of the present invention, a locking device is used for securing a heat sink 40 to an electronic device 50 such as a central processing unit (CPU) located on a printed circuit board 60. The locking device comprises a retention module 10 and two retainers 30 attached on the retention module 10.

The heat sink 40 comprises a base 42 having bottom, top faces and a plurality of fins 44 extending upwardly from the top face of the base 42. Two ends of the fins 44 extend outwardly beyond corresponding ends of the base 42. Some of the fins 44, for example, two separate sets of the fins 44 have lateral sides thereof extending outwardly two positioning portions 46 with a positioning channels 48 defined in an upper surface thereof, for positioning a corresponding retainer 30 therein.

The retention module 10 is located around the CPU 50. The retention module 10 is a substantially rectangular frame, and comprises a bottom wall 14 for supporting the heat sink 40, and two pairs of interconnecting sidewalls 12 extending upwardly from the bottom wall 14. The bottom wall 14 has a center thereof defining an opening 16 exposing the CPU 50. Four corners of the bottom wall 14 depend four corresponding fixing members (not shown) fixing the retention module 10 to the printed circuit board 60. Two opposite first clamping clasps 17 extend outwardly and upwardly from centers of their corresponding opposite sidewalls 12. Two second clamping clasps 18 extend upwardly and outwardly from another two opposite sidewalls 12. The first and second clamping clasps 17, 18 which lock with their corresponding retainer 30 are located adjacent to each other, but are remote from the other first, second clamping clasps 17, 18 which lock with the other retainer 30.

Each of the two retainers 30 comprises a clip 32 formed from a metallic wire with good strength, and an operating handle 34 attached to the clip 32.

The clip 32 is generally L-shaped and comprises a clamping portion 322 and an operating portion 326 perpendicularly extending from an end of the clamping portion 322. The clamping portion 322 comprises a first pressing portion 320, a second pressing portion 324 in alignment with the first pressing portion 320, and a catch 3224 descending from the first and second pressing portions 320, 324 via two connecting portions 3222 connecting with the first and second pressing portions 320, 324, respectively. The first pressing portion 320 is shorter than the second pressing portion 324. The catch 3224 is substantially U-shaped in a horizontal plane. A distal end of the operating portion 326 is offset from a main part thereof. A substantially right-angled corner 328 is formed at a joint of the second pressing portion 324 of the clamping portion 322 and the operating portion 326.

The handle 34 is molded from plastic, and comprises a main plate 340, an L-shaped coupling block 342 descend from the main plate 340, and a fence 346 extending upwardly from a side of the main plate 340 for facilitating operation. The coupling block 342 defines an L-shaped slot 344 therein.

The right-angled corner 328 of the clip 32 is fitted in the slot 344 of the block 342 of the handle 34. Therefore, the clip 32 and the handle 34 are coupled together. The distal end of the operating portion 326 of the clip 32 extends beyond the handle 34.

Figure 2:
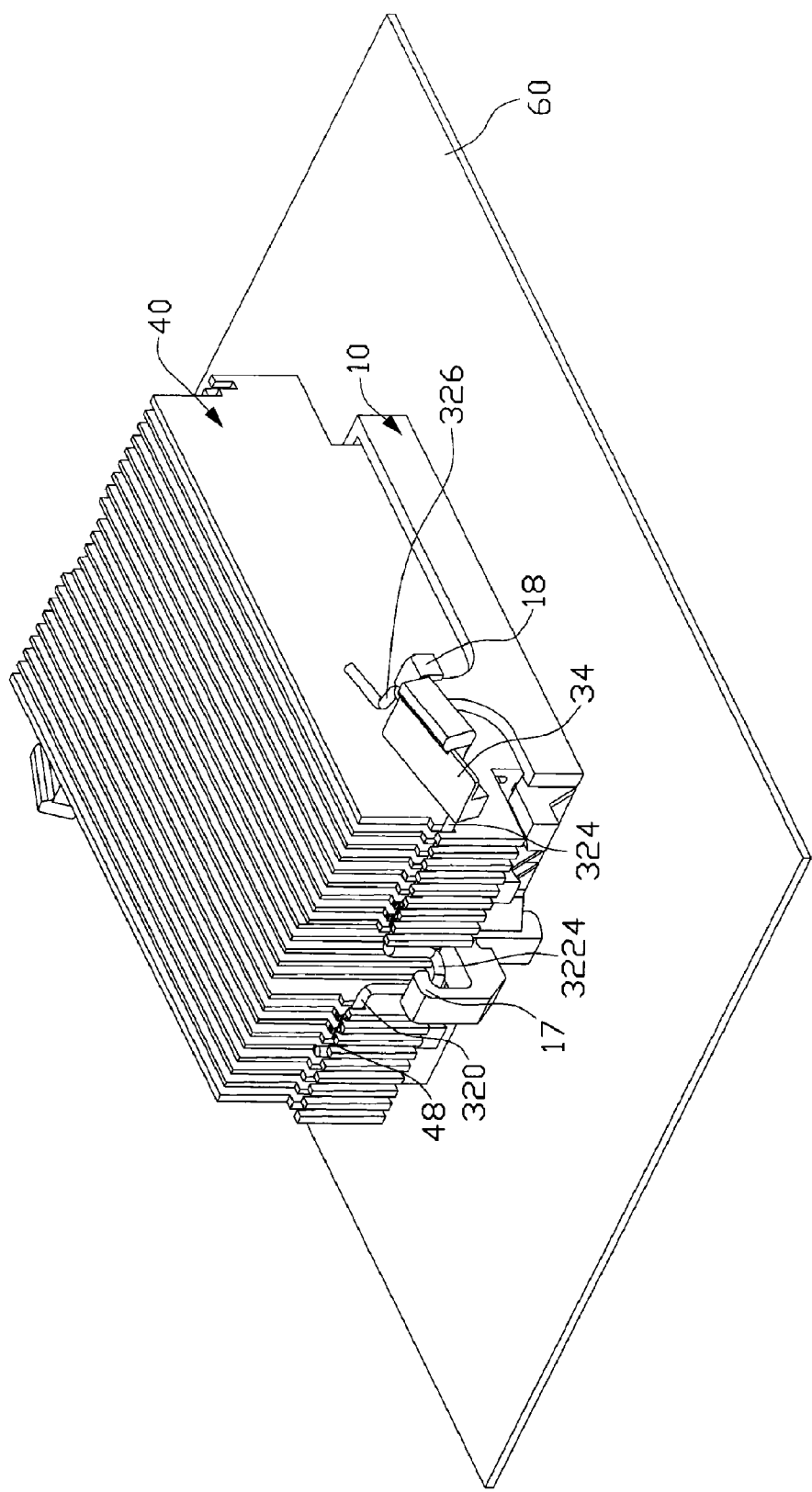
FIG. 2 is an assembled view of FIG. 1 wherein the locking device is in an unlocked position.
Figure 3:
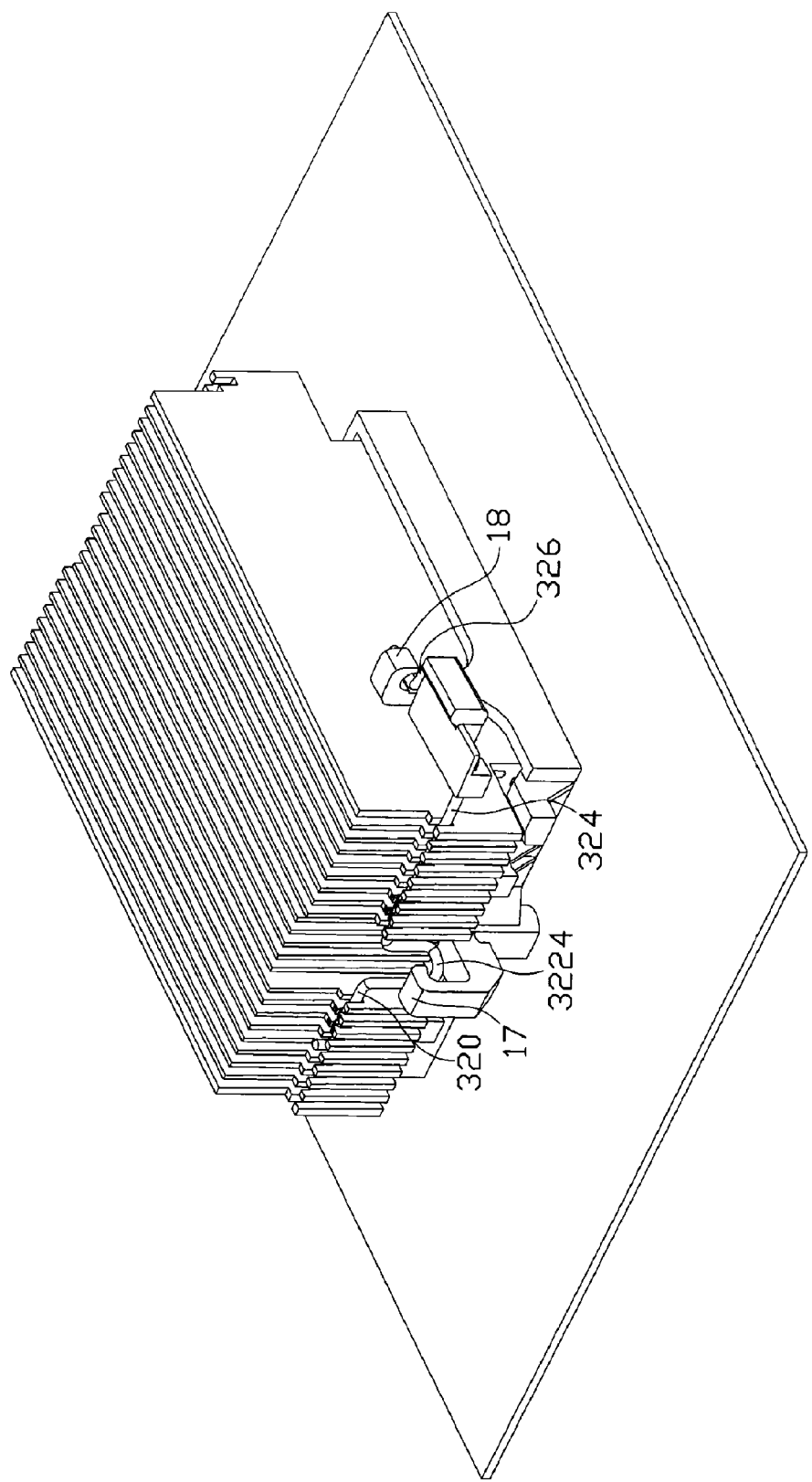
FIG. 3 is an assembled view of FIG. 1 wherein the locking device is in a locked position.

In assembly, the heat sink 40 is disposed in the retention module 10 with the bottom face thereof contacting the bottom wall 14 of the retention module 10 and the CPU 50. The retainers 30 are positioned on the fins 44 of the heat sink 40 via the first and second pressing portions 320, 324 being engaged in the channels 48 of the positioning portions 46 of the fins 44. The catches 3224 of the clamping portions 322 of the clips 32 are located between the positioning portions 46 of the fins 44 and engage with the first clasps 17 of the retention module 10. The handles 34 of the retainers 30 extend toward the second clasps 18 of the retention module 10. The distal ends of the operating portions 326 of the clips 32 are located above the second clasps 18 of the retention module 10 (see FIG. 2). The handles 34 of the retainers 30 are pressed and pulled outwardly to thereby engage the distal ends of the operating portions 326 of the clips 32 with the second clasps 18 of the retention module 10. During this operation, the clips 32 rotate with the catches 3244 being pressed by the first clasps 17 of the retention module 10, whereby the first and second pressing portions 320, 324 press the fins 44 downwards (see FIG. 3). Therefore, the heat sink 40 is pressed toward the retention module 10 and intimately contacts the CPU 50.

To remove of the heat sink 40 from the CPU 50, the operating portions 326 of the clips 32 of the retainers 30 are released from the second clasps 18 of the retention module 10. The catches 3244 are disengaged from the first clasps 17 of the retention module 10. In this way, the heat sink 40 can be quickly detached from the CPU 50.

According to this embodiment of the present invention, the heat sink 40 can be easily assembled/disassembled to/from the CPU 50 by operating the handles 34. Additionally, the clips 32 of the retainer 30 of the locking device are formed from wire, which has a simple manufacture process and low cost. Furthermore, the locking device has the handle 34 coupled to operating portions 326 of the clips 32, which facilitates the assembling or disassembling operation of the operator.

It is believed that the present embodiment and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a heat sink comprising a fin set defining two channels adjacent to two opposite ends thereof;
   a retention module supporting the heat sink thereon, with two pairs of first and second clasps extending therefrom; and
   two clips being positioned on the fin set, each of the two clips comprising first and second pressing portions fitted in corresponding channels defined adjacent to one of the two opposite ends of the fin set, a catch descending between the first and second pressing portions, and an operating portion extending from an end of the second pressing portion;
   wherein, when the heat dissipation device is in a locked position, the catches of the two clips engage with the first clasps of the retention module, the operating portions of the two clips engage with the second clasps of the retention module, the first and second pressing portions of the two clips engage with and press the fin set of the heat sink toward the retention module; and
   wherein the fin set has two lateral fins extending outwardly from each of the two opposite ends of the heat sink and at a distance beyond a base of the heat sink and has the channels each defined in tops of the two lateral fins, and the catch of each clip is located between the two lateral fins.

2. The heat dissipation device of claim 1, wherein each of the two clips is integrally made from a metallic wire and is substantially L-shaped.

3. An electronic assembly comprising:
   a printed circuit board;
   a heat-generating electronic component mounted on the printed circuit board;
   a retention module mounted on the printed circuit board and surrounding the electronic component, comprising upwardly extending first clasp and second clasp;
   a heat sink mounted in the retention module and thermally contacting with the electronic component;
   a substantially L-shaped clip having a clamping portion located at one end of the heat sink, and an operating portion perpendicularly extending from an end of the clamping portion, the clamping portion having first pressing portion and second pressing portion and a generally U-shaped catch interconnecting the first and second pressing portion, the first and second pressing portion engaging with the heat sink and pressing the heat sink downwardly toward the retention module, the catch engaging with the first clasp and the operating portion engaging with the second clasp; wherein the heat sink has a base thermally contacting with the electronic component and a plurality of fins extending upwardly from the base, the fins having two spaced positioning portions extending laterally from a lateral side of the fins, the first and second pressing portions engaging in tops of the two positioning portions of the fins, respectively, and the catch being located between the two positioning portions of the fins, and the positioning portions of the fins extend laterally beyond a lateral side of the base.

4. The electronic assembly as claimed in claim 3, wherein the operating portion is fitted with a plastic handle for facilitating operation of the clip.

* * * * *